United States Patent [19]
Kreuzer

[11] Patent Number: 5,757,160
[45] Date of Patent: May 26, 1998

[54] MOVING INTERFEROMETER WAFER STAGE

[75] Inventor: Justin Kreuzer, Trumbull, Conn.

[73] Assignee: SVG Lithography Systems, Inc., Wilton, Conn.

[21] Appl. No.: 785,764

[22] Filed: Dec. 23, 1996

[51] Int. Cl.$^6$ .................................................. G01B 9/02
[52] U.S. Cl. ........................... 318/649; 318/640; 33/1 M; 356/358; 356/363
[58] Field of Search ........................... 318/640, 648, 318/649, 687; 33/1 M; 74/471; 269/73; 356/357, 358, 363; 414/749

[56] References Cited

U.S. PATENT DOCUMENTS

| | | | |
|---|---|---|---|
| 3,648,048 | 3/1972 | Cahan et al. | |
| 4,952,858 | 8/1990 | Galburt | 318/647 |
| 4,984,891 | 1/1991 | Miyazaki et al. | 356/358 |
| 5,285,142 | 2/1994 | Galburt et al. | 318/640 |
| 5,363,196 | 11/1994 | Cameron | 356/358 |

*Primary Examiner*—Bentsu Ro
*Attorney, Agent, or Firm*—Paul A. Fattibene; Arthur T. Fattibene; Fattibene and Fattibene

[57] ABSTRACT

A stage used for positioning and aligning a wafer, as used in photolithography or microlithography in semiconductor manufacturing having a plurality of interferometer laser gauges placed on a movable wafer stage associated with a pair of stationary orthogonal return mirrors. A beam of light parallel to the X axes is directed through a penta prism to an interferometer laser gauges placed on the wafer stage near the wafer plane through a plurality of beamsplitters and fold mirrors. The present invention is less sensitive to rotation or twisting of the wafer stage and eliminates or reduces certain errors introduced by the rotation. Additionally, large stable return mirrors may be used, increasing the travel distance permitted by the wafer stage while reducing weight on the wafer stage. The wafer stage can be more accurately positioned and accommodate larger wafer sizes with improved positioning and alignment accuracies.

19 Claims, 2 Drawing Sheets

MOVING INTERFEROMETER WAFER STAGE

FIELD OF THE INVENTION

This invention relates generally to photolithography as used in semiconductor manufacturing, and particularly to a wafer stage with accurate positioning and alignment.

BACKGROUND OF THE INVENTION

In the manufacture of semiconductor devices and flat panel displays, photolithography or microlithography is often used. A substrate or wafer stage on which a semiconductor wafer or other substrate is placed is used to align and position the wafer during exposure. A wafer stage used in aligning and positioning a wafer is disclosed in U.S. Pat. No. 4,952,858 entitled "Microlithographic Apparatus" issuing Aug. 28, 1990 to Daniel N. Galburt, which is herein incorporated by reference. Therein disclosed is an electromagnetic alignment apparatus including a monolithic stage, a substage, and an isolated reference structure. Another wafer stage is disclosed in U.S. Pat. No. 5,285,142 entitled "Wafer Stage With Reference Surface" issuing Feb. 8, 1994 to Daniel N. Galburt and Jeffrey O'Connor, which is herein incorporated by reference. Therein disclosed is an electromagnetic substage and an electromagnetic monolithic stage coupled such that one follows the other and having a single reference surface extending over the entire range of motion of the monolithic stage. Additionally disclosed therein are interferometer return mirrors placed on the wafer stage. Interferometer return mirrors are used in an interferometer alignment system for accurately positioning and aligning a wafer stage. The interferometer return mirrors have always been placed on the wafer stage with the interferometers placed off of the wafer stage. While this has been acceptable for most photolithographic operations, as the wafer size becomes larger and the feature size of the circuit elements become smaller, there is a need to improve the structure of wafer stages to improve positioning and alignment of the wafer. The return mirrors in an interferometer system must be stable, and are therefor usually large and heavy. Because of the increasing wafer size, the wafer stage must travel longer distances. This results in large, heavy interferometer return mirrors being placed on the wafer stage. As a result, it is often difficult to quickly and accurately move the wafer stage. Additionally, the mirrors being mounted on the wafer stage are sensitive to rotation of the wafer stage which results in errors being introduced, often referred to as cosine errors. Additionally, when the wafer stage is rotated, an optical signal loss occurs which limits stage travel and rotation and requires a larger, more powerful laser illumination source to be used with the interferometer. Accordingly, there is a need to improve upon the conventional wafer stage structure to enhance positioning and alignment accuracies as well as reducing the weight and power required in conventional wafer stages.

SUMMARY OF THE INVENTION

The present invention is directed to a wafer stage having a plurality of interferometers placed thereon. The interferometers move with the wafer stage. Two stationary orthogonal return interferometer mirrors are placed adjacent the wafer stage and are used in conjunction with the interferometers placed on the wafer stage in order to obtain accurate alignment and positioning information. In one embodiment, the wafer stage is mounted vertically and a laser beam is folded using a penta prism and directed to the plurality of interferometers on the wafer stage through a plurality of beamsplitters and fold mirrors.

Accordingly, it is an object of the present invention to reduce errors in positioning and alignment of a wafer stage.

It is a further object of the present invention to reduce the size and weight of a wafer stage or to increase the travel distance of a wafer stage without increasing the size or weight of the wafer stage.

It is an advantage of the present invention that a lower power laser illumination source may be used.

It is a further advantage of the present invention that it is more tolerant of rotation or twisting of the wafer stage.

It is a feature of the present invention that interferometers are placed on the moving wafer stage.

It is a feature of the present invention that the stationary interferometer return mirrors are placed off of the moving wafer stage.

It is a further feature of the present invention that an appropriate system of mirrors such as a penta prism is used to maintain a beam orthogonal to the stationary return mirrors irrespective of some twisting or rotation in the substrate plane of the wafer stage.

These and other objects, advantages, and features will become readily apparent in view of the following more detailed description.

DETAILED DESCRIPTION OF THE PREFERRED EMBODIMENTS

Figure 1:
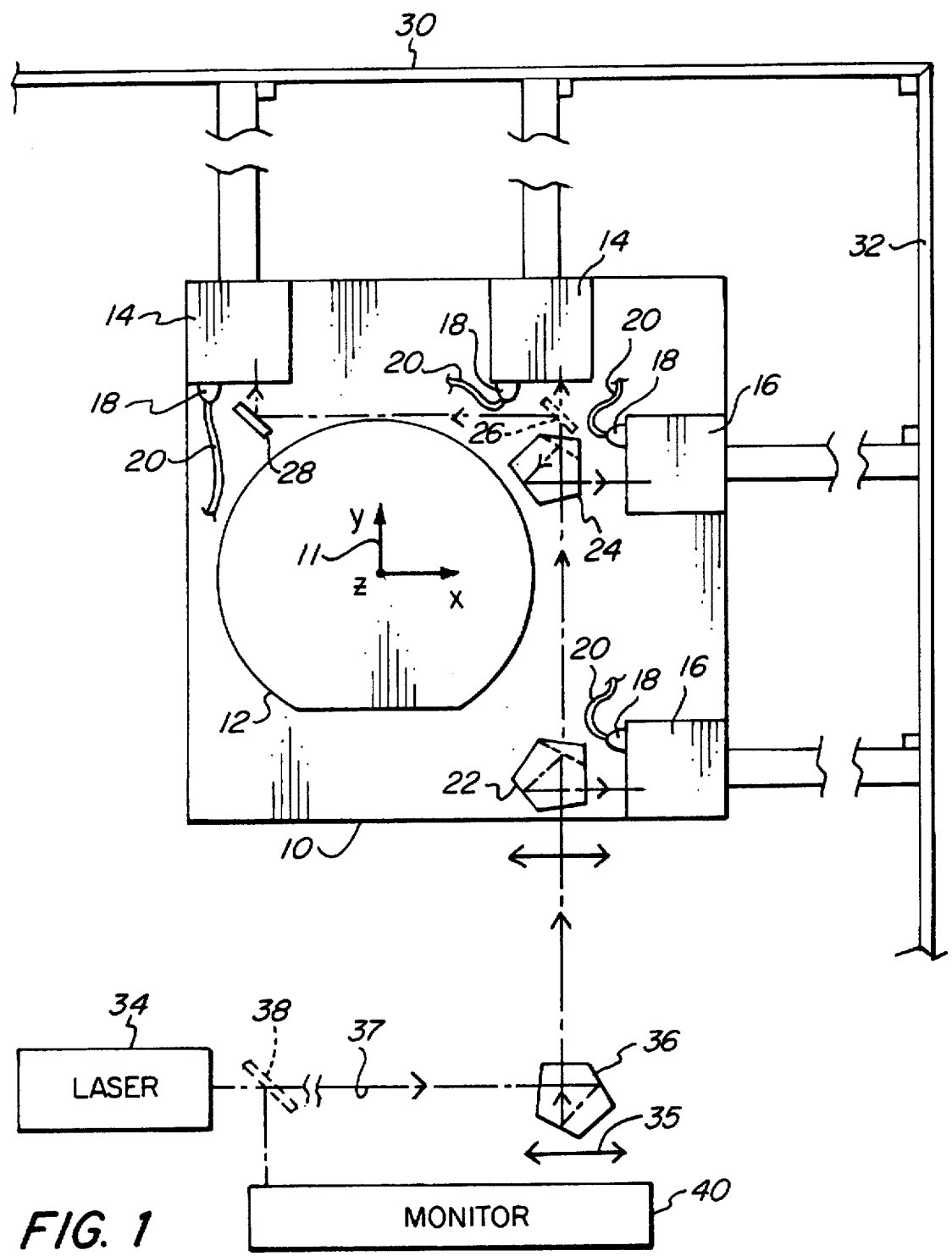
FIG. 1 schematically illustrates the present invention.

FIG. 1 schematically illustrates the present invention. A wafer stage 10 has a wafer 12 placed thereon. The wafer stage 10 has a right-handed, (X, Y, Z) Cartesian coordinate system 11 centered over the wafer 12. Also placed on the wafer stage 10 are four laser gauge type interferometers 14 and 16 positioned along the X-axis and the Y-axis respectively, of the edges of the wafer stage 10. Light from the interferometers 14 and 16 travels to two orthogonal reference mirrors 30 and 32. Light from interferometers 14 travels in the Y-direction to the stationary return mirror 30 located with its face parallel to the X-Z-plane. Light from interferometers 16 travels in the X-direction to a second stationary return mirror 32 located with its face parallel to the Y-Z-plane. The term light as used in this application is meant to refer to electromagnetic radiation of any wavelength, and not only to light in the visible spectrum.

In the simplest configuration three single-axis plane mirror type interferometers, incorporating corner cubes occupy any three of the four interferometer positions. When illuminated each plane mirror interferometer has a metrology axis in the direction of the illumination that should be set normal to the associated-reference mirror. As shown in FIG. 1, it may be desirable to add a fourth interferometer of the same type to provide nominally redundant information for error correction and other purposes. In this configuration, the four interferometer laser beams are aligned in a plane that is nominally parallel to the wafer plane. All alignment information furnished by the laser gauges or interferometers 14, 16 is referenced to a plane parallel to the wafer plane. For the critical overlay alignment requirements of microlithography, it is necessary to provide small motion control and alignment of the wafer in six degrees-of-freedom, three in the wafer plane and three perpendicular to the wafer plane. The wafer stage 10 is free to move relatively large distances, more than one wafer diameter, in the in-plane or X-Y-directions, as long as the interferometer laser beams fall onto the reference mirrors 30 and 32, and rotation about the Z-axis is typically restricted to less than about several milliradians. For the other three degrees-of-freedom, system constraints allow only very small motions. The preceding configuration provides information needed to control the three in-plane degrees-of-freedom. Alternative means, not necessarily optically-based, must be established to provide control information for the other three. The faces of the two reference mirrors 30 and 32 define five degrees-of-freedom. Five plane mirror type interferometers can be located on the wafer stage 10 and directed at the reference mirrors 30 and 32 to provide useful information for these five degrees-of-freedom. In one convenient configuration, the five interferometers may include the two interferometers 16 and one of the interferometers 14, for example the rightmost one, with the addition of two more interferometers, not shown. The two additional interferometers may be placed, one under the selected rightmost interferometer 14, and the other located under either one of the interferometers 16. The two additional interferometers, not shown, therefore are offset in the negative Z-direction, into the page, with respect to the interferometers 14 and 16. Mirrors 30 and 32 would be made wider in the same negative Z-direction to accommodate the additional interferometer laser beams. Typically, the measurement axis of three interferometers would lie in a plane parallel to the wafer. The measurement axis of the other two interferometers would lie in a parallel plane offset along the Z-axis. The remaining required sixth degree-of-freedom, Z-axis location, requires an additional reference structure. Two forms of such a reference structure of particular interest are both structures parallel to the wafer plane. One structure, not shown, located above the wafer 12 surface could hold one or three sensors that measure the distance to the wafer thereby providing Z or all three out-of-plane information. Alternatively, the structure could be a mirror with its face parallel to the X-Y-plane. The reference structure mirror provides a flat reference surface parallel to the plane defined by the wafer 10. The Z or all out-of-plane metrology information could be measured with one or three sensors, including interferometers, on the wafer stage.

All of the reference items must be mechanically stable with respect to each other and the photolithography image that will be printed.

The interferometer metrology axes should be spaced as far apart as possible - typically of the order of one wafer diameter. It is possible to replace several single-axis interferometers with appropriately selected multi-axis interferometers.

The Hewlett-Packard Company, Test and Measurement Organization, manufactures an extensive line of laser gauge components that are useful with this invention. These components belong to their commercial product line listed as "laser interferometer positioning systems" in their current 1996 catalogue. Catalogue components relevant to this invention include: laser heads; beam directing optics; one-, two-, and three-axis interferometers; fiber optic-fed detectors; and the associated metrology electronics.

Each interferometer 14 and 16 has an output 18. The output 18 is coupled to a photodetector, not shown, through fiber optic cable 20. The fiber optic cable 20 may be mechanically coupled to the interferometer or it may be mechanically decoupled and only coupled optically in a manner similar to the optical input feed options described below.

Figure 2:
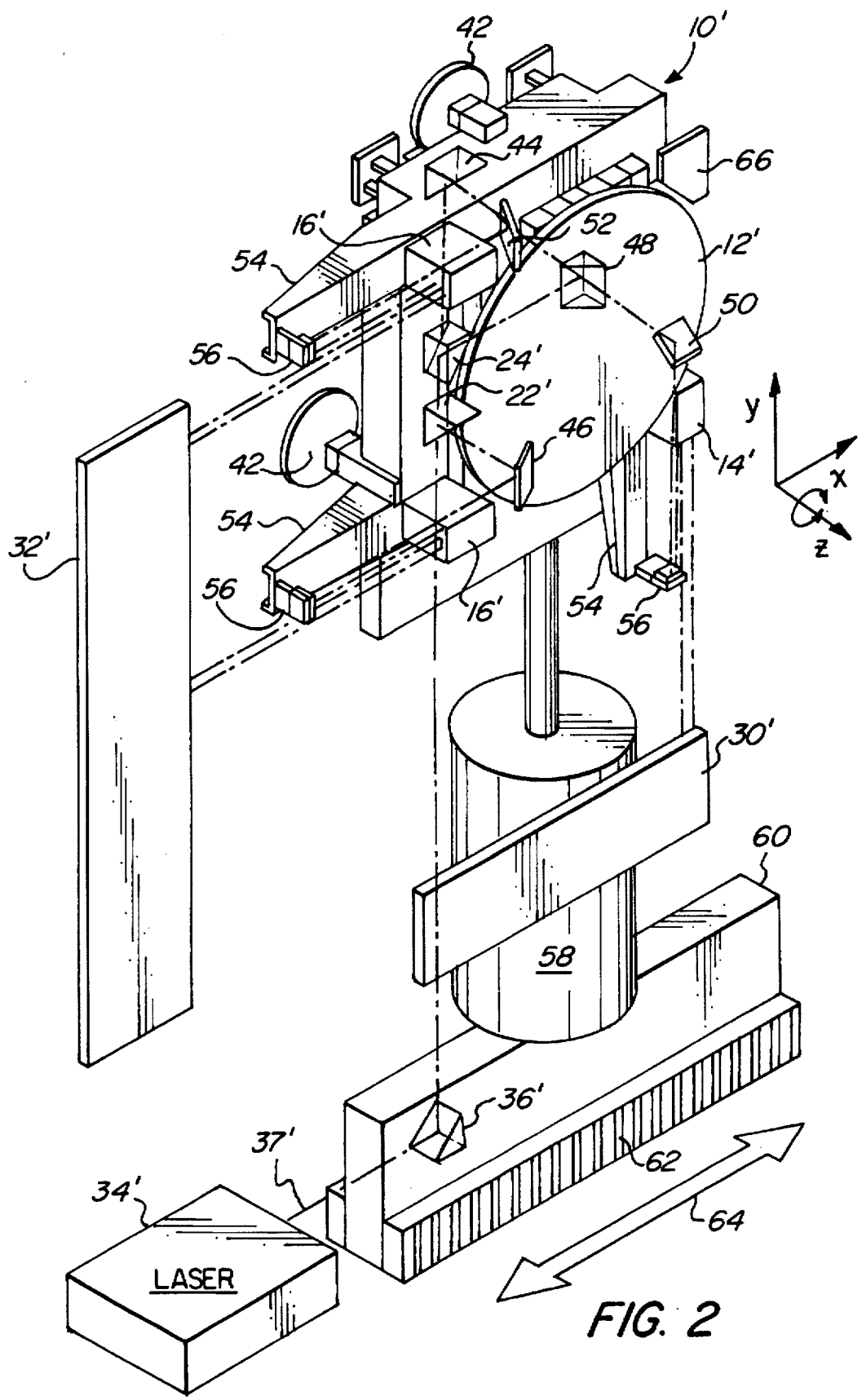
FIG. 2 is a perspective view illustrating one embodiment of the present invention.

Each of the interferometers 14, 16 should be illuminated so that the metrology axis is maintained as perpendicular to the associated-mirror 30, 32 face as possible. The interferometers 14, 16 can be illuminated as a group with the illumination distributed from a less precisely positioned single-axis stage to optics on the wafer stage 10, for example as illustrated in FIG. 1. Alternatively, the illumination can feed each of the interferometers 14, 16 separately with the distribution optics not on the wafer stage 10, but on a less precisely positioned stage. This latter concept is illustrated in FIG. 2.

A first penta prism beamsplitter 22 is placed adjacent one of the interferometer laser gauges 16. A second penta prism beamsplitter 24 is placed adjacent the other interferometer laser gauge 16. A beamsplitter 26 is placed adjacent penta prism beamsplitter 24 and is used to fold or direct light to a second beam folder or fold mirror 28 adjacent one of the interferometer laser gauges 14. A laser 34 is positioned off of the wafer stage 10 and directs a beam of light 37 parallel to the X axis. A penta prism 36 is positioned to receive the light from laser 34 and directs the light to penta prism beamsplitter 22 on the wafer stage 10. A beamsplitter 38 directs a portion of the light from the laser 34 to a wavelength monitor 40.

The penta prism 36 is mounted so as to follow, in the X direction, the travel of the wafer stage 10, as indicated by the double headed arrow 35. Current technology laser gauge lasers are relatively large and typically would be mounted on a stationary platform so that it is convenient to illuminate the interferometers as shown in FIG. 1 and FIG. 2 starting with penta-prism 36 moving on a single-axis stage that moves in the direction of arrow 35 parallel to the laser light and normal to reference mirror 32. Although the interferometer metrology axis orthogonality to the reference mirror is sensitive to rotations in the wafer plane by the single-axis stage, penta-prism 36 can be replaced by a fold mirror if these rotations are small enough.

In principle, the laser 34 could be attached directly to the one-axis stage and aligned with its light perpendicular to mirror 30. The wavelength monitor 40 is used to monitor and determine the status of the atmosphere as it affects the laser 34.

In operation, the laser 34 emits a light beam 37, a portion of which is split by beamsplitter 38 and directed to the wavelength monitor 40. Most of the light beam 37 is directed to the penta prism 36, which redirects the light to penta prism beamsplitter 22. The penta prism beamsplitter 22 permits a portion of the light to continue to penta prism beamsplitter 24. A portion of the light is reflected by penta prism beamsplitter 22 and directed to the adjacent interferometer 16. One of the emerging beams is directed to the adjacent interferometer laser gauge 16 and is perpendicular to the beam of light entering the penta prism beamsplitter 22. The light enters the interferometer laser gauge 16 and is directed to and reflected from the return mirror 32. The output 18 is carried to a photodetector, not shown, by fiber optic cable 20. From this output, information is obtained as to the location of the wafer stage 10, from which position and alignment information is calculated using conventional known techniques. The light entering penta prism beamsplitter 24 is similarly directed to the adjacent interferometer laser gauge 16. A portion of the light is split and directed to beamsplitter 26. A portion of the light entering beamsplitter 26 is directed to the adjacent interferometer laser gauge 14, and a portion of the light is folded to beam folder or fold mirror 28. The fold mirror 28 folds the light and directs it to the adjacent interferometer laser gauge 14. While four interferometer laser gauges 14 and 16 are illustrated, it should be appreciated that only three are generally needed. However, four may be used for redundancy if desired.

Typically, the laser 34 may be placed a distance 50 to 150 cm from the penta prism 36. In some applications, where the size or heat of the laser is undesirable, the laser 34 may be placed even further away. The penta prism 36 may be mounted from 20 to 50 cm from the furthest extended travel of the wafer stage 10. The two interferometer laser gauges 14 may be separated by a distance of approximately 20 cm. Similarly, the two interferometer laser gauges 14 may be separated by a distance of approximately 20 cm. Each interferometer 14 and 16 is typically placed 2 to 32 cm from the return mirrors 30 and 32, respectively. The above dimensions are only given by way of example, and other dimensions may be appropriate depending on the particular application.

Many advantages are obtained by the structure of the present invention. By placing the mirrors off the wafer stage, the mirrors can be made larger and more stable, and more accurately manufactured at lower cost. Additionally, the wafer stage can be made smaller and of less weight. Wafer stage rotation accuracy is also improved by increasing the separation of the paired interferometers without increasing the size of the wafer stage, which would normally be required if the mirrors were mounted on the laser stage as is conventionally done. Additionally, it is also possible to mount the interferometers so as to place them in or close to the wafer plane, eliminating errors such as Abbe offset error. Additionally, with the structure of the present invention, the angle at which the input beam enters the interferometer does not influence alignment. Therefore, some degree of rotation about the Z axis, of approximately two milliradians, is possible without affecting alignment or position accuracy, depending upon the type of interferometer laser gauge used. Typically, the wafer stage 10 has three laser gauge interferometers placed close to the wafer plane for measuring three degrees of freedom, X-translation, Y-translation, and Z rotation. The three laser gauge interferometers are preferably mounted on the wafer stage 10 forming a right triangle, with the two short legs between the 90° angle being parallel to the respective longitudinal axis of the return mirrors 30 and 32.

FIG. 2 is a perspective view generally illustrating an embodiment implementing the schematic drawing of FIG. 1. A wafer stage 10' has a wafer chuck 12' placed thereon. A wafer, not shown, is placed on the wafer chuck 12'. An interferometer 14' is positioned at one corner of the wafer stage 10'. A pair of interferometer laser gauges 16' are positioned parallel to the Y axis. Accordingly, in this embodiment only three interferometer laser gauges 14' and 16' are needed in order to obtain sufficient positioning and alignment information. The wafer stage 10' typically has three degrees of freedom in the Y-translation, X-translation, and Z-rotation. Between the pair of interferometers 16' are placed the first beamsplitter 22', which may be a penta prism, and a second beamsplitter 24', which also may be a penta prism. A pair of beam folders or fold mirrors 44 and 52 are used to direct the light beam to one of the interferometers 16'. A beam folder or fold mirror 46 is associated with the other interferometer 16' and directs the light beam thereto. Beam folder or fold mirror 48 and fold mirror 50 are associated with interferometer 14' and directs the light beam thereto. Associated with each interferometer 14' and 16' is an arm 54 having a reference mirror 56 thereon. The wafer stage 10' rides on air bearings 42, preferably three are used in a triangular arrangement, with only two being illustrated. The air bearings 42 ride on a plane surface, not shown. When the wafer stage 10' is positioned vertically, a counter force cylinder 58 is used to compensate for the weight of the wafer stage 10'. The counter force cylinder 58 is attached to a support 60 which is coupled to a motor or linear drive 62. The motor or linear drive 62 permits the wafer stage 10' to be moved in the X direction, indicated by arrow 64. A stationary return mirror 32' is placed parallel to the Y axis formed by the pair of interferometer 16'. The return mirror 32' has a length sufficient to accommodate the entire travel distance of the wafer stage 10' in the Y direction. A stationary return mirror 30' is positioned parallel to the X axis, and has a length sufficient to accommodate the entire travel distance of the wafer stage 10' in the X direction. Accordingly, the stationary return mirrors 30' and 32' can be made relatively large and stable because they are not placed on the wafer stage 10'. Also associated with the wafer stage 10' is a calibration detector 66. Calibration detector 66 is used in some alignment and positioning operations.

In operation, a laser source 34' provides a beam of light 37' which is directed parallel to the X axis. The beam enters a penta prism 36' which folds or redirects the beam 90° to a beamsplitter 22', which may be a penta prism. The beamsplitter 22' directs a portion of the beam to a fold mirror 46 and another portion of the beam to another beamsplitter 24', which may be a penta prism. The fold mirror 46 directs the beam to a first interferometer 16'. Beamsplitter 24' directs a portion of the beam to another fold mirror or beam folder 48 and a portion of the beam to a fold mirror or beam folder 44. The fold mirror or beam folder 48 directs the beam to a fold mirror or beam folder 50, which directs the beam to interferometer 14'. The beam received by the beam folder or fold mirror 44 directs the beam to beam folder or fold mirror 52. Beam folder or fold mirror 52 then directs the beam of light to the second interferometer laser gauge 16'. The three interferometer laser gauges 16' and 14' are used in association with the stationary mirrors 30' and 32' to accurately obtain position and alignment information on the precise location of the wafer stage 10' in X-translation, Y-translation and Z-rotation. The three interferometers 14' and 16' preferably form a right triangle in a plane parallel to the planar surface of the wafer chuck 12'. Preferably, the interferometer laser gauges 14' and 16' are placed near the wafer plane, thereby eliminating errors such as abbe offset errors. Additionally, the structure of the present invention with the use of penta prisms helps to maintain the alignment of the interferometer laser gauges irrespective of small rotations or twisting about the Z axis, and therefore, is less sensitive to rotation than conventional alignment systems using interferometers.

The present invention improves the range of travel of a wafer stage having less mass or weight, while at the same time improving alignment and positioning accuracies and being less sensitive to certain errors introduced by rotation, or having the interferometers positioned away from the wafer plane. Accordingly, the present invention improves and advances the art.

Although the preferred embodiment has been illustrated, it will be obvious to those skilled in the art that various modifications may be made without departing from the spirit and scope of this invention.

What is claimed is:

1. A positioning and alignment system comprising:
a wafer stage having a range of travel;

at least three interferometers placed on said wafer stage, two of said at least three interferometers having output beams that are parallel, and the other of said at least three interferometers having an output beam that is perpendicular to the output beams of the two of said at least three interferometers;

a first stationary mirror placed adjacent said wafer stage, said first stationary mirror having a length to accommodate the range of travel of said wafer stage; and optics directing a beam of light to said at least three interferometers on said wafer stage, whereby said wafer stage can be accurately positioned and aligned.

2. A positioning and alignment system comprising:

a wafer stage having a range of travel;

an interferometer placed on said wafer stage;

a first stationary mirror placed adjacent said wafer stage, said first stationary mirror having a length to accommodate the range of travel of said wafer stage;

a fold mirror directing a beam of light to said interferometer on said wafer stage;

a second stationary mirror placed adjacent said wafer stage and orthogonal to said first stationary mirror, said second stationary mirror having a length to accommodate the range of travel of said wafer stage;

a pair of interferometers placed on said wafer stage; and a plurality of beamsplitters directing the beam of light to said pair of interferometers, wherein said interferometer and said pair of interferometers are positioned on said wafer stage to form a right triangle, whereby said wafer stage can be accurately positioned and aligned.

3. A positioning and alignment system as in claim 2 wherein said pair of interferometers is separated from each other by at least 20 cm.

4. A positioning and alignment system as in claim 2 further comprising:

a laser source, said laser source directing a beam of light substantially parallel to either said first stationary mirror or said second stationary mirror; and a penta prism positioned to receive the beam of light.

5. A positioning and alignment system as in claim 2 further comprising:

a laser source, said laser source directing a beam of laser light pointed in a substantially stable direction and perpendicular with respect to one of said first or second stationary mirrors;

a penta prism aligned to receive the beam of laser light;

a single axis wafer stage carrying the penta-prism and able to travel parallel to the beam of laser light propagation direction while tracking said single axis wafer stage in this same axis in order to direct the beam of laser light into said interferometer and said pair of interferometers;

a set of fold mirrors and beamsplitters to distribute the beam of laser light to the said interferometer and said pair of interferometers while maintaining the beam of laser light substantially normal to the first or second stationary mirrors associated with each respective interferometer.

6. A positioning and alignment system in claim 2 further comprising:

a laser source, said laser source directing a beam of laser light pointed in a substantially stable direction with respect to both of said first and second stationary mirrors; and means to direct said laser light into each respective interferometer so as to maintain the laser light nominally normal to the said first or second stationary mirror associated with each respective interferometer.

7. A positioning and alignment system for use in photolithography comprising:

a wafer stage;

a first interferometer placed on said wafer stage;

a second interferometer placed on said wafer stage;

a third interferometer placed on said wafer stage;

a first stationary return mirror, said first stationary return mirror having a surface substantially parallel to a line formed between said first and second interferometers, and positioned to receive a beam of light from said first and second interferometers;

a second stationary return mirror, said second stationary return mirror having a surface substantially perpendicular to the surface of said first stationary return mirror, and positioned to receive the beam of light from said third interferometer; and a plurality of beamsplitters positioned to direct the beam of light to said first, second, and third interferometers.

8. A positioning and alignment system as in claim 7 wherein:

said plurality of beamsplitters include at least one penta prism.

9. A positioning and alignment system as in claim 7 further comprising:

a penta prism placed off of said wafer stage and positioned to direct the beam of light onto one of said plurality of beamsplitters.

10. A positioning and alignment system as in claim 9 wherein:

said penta prism moves with said wafer stage in one axis only.

11. A positioning and alignment system as in claim 10 further comprising:

an laser source, said laser source directing a beam of light substantially parallel to the one axis and onto said penta prism.

12. A positioning and alignment system as in claim 11 further comprising:

a support coupled to said wafer stage, said support moving with said wafer stage in the one axis and having said penta prism mounted thereon; and . a motor, said motor driving said support along the one axis.

13. A positioning and alignment system used in photolithography for aligning and positioning a wafer comprising:

a movable wafer stage, said wafer stage having three degrees of freedom;

at least three interferometers placed on said wafer stage and moving with said wafer stage;

a first stationary return mirror having a longitudinal axis and positioned to receive a beam of light from two of said at least three interferometers;

a second stationary return mirror having a longitudinal axis and positioned to receive a beam of light from one of said at least three interferometers, the longitudinal axis of said second stationary return mirror being perpendicular to the longitudinal axis of said first stationary return mirror;

counter force means for supporting said wafer stage;

a support attached to said counter force means;

a penta prism mounted on said support;

a motor, said motor driving said support along a single axis;

a laser source directing a beam of light to said penta prism, whereby the beam of light from said laser source is folded by said penta prism and directed to said at least three interferometers providing a relatively light wafer stage having improved range of motion that is tolerant of some twisting or rotation.

14. A positioning and alignment system comprising:

a stage having a range of travel;

at least three interferometers each having an output beam placed on said stage, said at least three interferometers positioned so that at least two output beams are parallel and the other output beam is perpendicular to the at least two output beams;

a first stationary mirror placed adjacent said stage, said first stationary mirror having a length to accommodate the range of travel of said stage along a first axis parallel to said first stationary mirror;

a second stationary mirror placed adjacent said stage and orthogonal to said first stationary mirror, said second stationary mirror having a length to accommodate the range of travel of said stage along a second axis parallel to said second stationary mirror; and means for providing a laser beam to said at least three interferometers placed on said stage, whereby said stage can be accurately positioned and aligned.

15. A positioning and alignment system as in claim 14 wherein:

said means for providing a laser beam comprises a fold mirror.

16. A positioning and alignment system as in claim 14 wherein:

said means for providing a laser beam comprises a prism.

17. A positioning and alignment system as in claim 14 wherein:

said means for providing a laser beam comprises means for maintaining alignment during stage rotations of less than two milliradians.

18. A positioning and alignment system as in claim 14 wherein:

the at least two output beams and the other output beam are in a first plane.

19. A positioning and alignment system as in claim 18 further comprising:

an additional interferometer having an additional output beam, the additional output beam being in a plane offset from the first plane.

* * * * *